United States Patent
Yeo et al.

(10) Patent No.: US 8,635,515 B1
(45) Date of Patent: *Jan. 21, 2014

(54) MULTI-PARITY TENSOR-PRODUCT CODE FOR DATA CHANNEL

(71) Applicant: Marvell International Ltd., Hamilton (BM)

(72) Inventors: Engling Yeo, San Jose, CA (US); Manoj Kumar Yadav, San Jose, CA (US); Panu Chaichanavong, Sunnyvale, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 18 days.

This patent is subject to a terminal disclaimer.

(21) Appl. No.: 13/674,512

(22) Filed: Nov. 12, 2012

Related U.S. Application Data

(63) Continuation of application No. 12/604,558, filed on Oct. 23, 2009, now Pat. No. 8,321,769.

(60) Provisional application No. 61/112,066, filed on Nov. 6, 2008.

(51) Int. Cl.
   *H03M 13/00* (2006.01)

(52) U.S. Cl.
   USPC .......................................................... 714/785

(58) Field of Classification Search
   USPC .......................................................... 714/785
   See application file for complete search history.

(56) References Cited

U.S. PATENT DOCUMENTS

| | | |
|---|---|---|
| 4,295,218 A | 10/1981 | Tanner |
| 4,601,044 A | 7/1986 | Kromer, III et al. |
| 5,537,444 A | 7/1996 | Nill et al. |
| 5,757,821 A | 5/1998 | Jamal et al. |
| 5,926,232 A | 7/1999 | Mangold et al. |
| 5,930,272 A | 7/1999 | Thesling |
| 5,933,462 A | 8/1999 | Viterbi et al. |

(Continued)

FOREIGN PATENT DOCUMENTS

| | | |
|---|---|---|
| JP | 2004-164767 | 6/2004 |
| WO | WO 96/37050 | 11/1996 |
| WO | WO 00/19616 | 4/2000 |

OTHER PUBLICATIONS

Shoemake, M.B., et al., "Computationally Efficient Turbo Decoding with the Bi-directional Viterbi Algorithm (BIVA)," *Proceedings of the IEEE International Symposium on Information Theory*, 1997, p. 228.

(Continued)

*Primary Examiner* — Michael Maskulinski

(57) ABSTRACT

Encoder and decoder apparatus and methods derive a plurality of parity bits from a single codeword. Encoder apparatus may include a receive module receiving a data stream, a parity generation module generating a plurality of parity bits based on the data stream and a word of a tensor-product code, and a parity insertion module combining the plurality of parity bits and the data stream to generate encoded bits. Decoder apparatus may include a detector receiving and outputting encoded data, a first decoder generating first log-likelihood ratios (LLRs) from the encoded data, an error recovery module generating second LLRs from the encoded data, a second decoder that derives syndrome data from the first and second LLRs, a post-processor that combines data from the first decoder with error events from the error recovery module to generate corrected data, the post-processor further identifying a plurality of parity bits in the corrected data.

21 Claims, 16 Drawing Sheets

(56) References Cited

U.S. PATENT DOCUMENTS

| | | | |
|---|---|---|---|
| 5,949,831 | A | 9/1999 | Coker et al. |
| 5,974,540 | A | 10/1999 | Morikawa et al. |
| 5,983,385 | A | 11/1999 | Khayrallah et al. |
| 6,002,716 | A | 12/1999 | Meyer et al. |
| 6,009,549 | A | 12/1999 | Bliss et al. |
| 6,021,518 | A | 2/2000 | Pelz |
| 6,023,783 | A | 2/2000 | Divsalar et al. |
| 6,028,728 | A | 2/2000 | Reed |
| 6,081,918 | A | 6/2000 | Spielman |
| 6,145,114 | A | 11/2000 | Crozier et al. |
| 6,145,144 | A | 11/2000 | Poehlmann et al. |
| 6,161,209 | A | 12/2000 | Moher |
| 6,182,261 | B1 | 1/2001 | Haller et al. |
| 6,219,817 | B1 | 4/2001 | Holman |
| 6,427,220 | B1 | 7/2002 | Vityaev |
| 6,438,180 | B1 | 8/2002 | Kavcic et al. |
| 6,539,367 | B1 | 3/2003 | Blanksby et al. |
| 6,581,181 | B1 | 6/2003 | Sonu |
| 6,634,007 | B1 | 10/2003 | Koetter et al. |
| 6,691,263 | B2 | 2/2004 | Vasic et al. |
| 6,708,308 | B2 | 3/2004 | De Souza et al. |
| 6,715,121 | B1 | 3/2004 | Laurent |
| 6,888,897 | B1 | 5/2005 | Nazari et al. |
| 6,965,652 | B1 | 11/2005 | Burd et al. |
| 7,000,177 | B1 | 2/2006 | Wu et al. |
| 7,072,417 | B1 | 7/2006 | Burd et al. |
| 7,099,411 | B1 | 8/2006 | Wu et al. |
| 7,184,486 | B1 | 2/2007 | Wu et al. |
| 7,765,458 | B1 | 7/2010 | Yang et al. |
| 7,861,131 | B1 | 12/2010 | Xu et al. |
| 8,019,020 | B1 | 9/2011 | Chaichanavong et al. |
| 8,028,216 | B1 | 9/2011 | Yeo et al. |
| 8,145,983 | B1 | 3/2012 | Chaichanavong et al. |
| 8,181,081 | B1 | 5/2012 | Yeo et al. |
| 2007/0043997 | A1 | 2/2007 | Yang et al. |

OTHER PUBLICATIONS

Viterbi, A., "An Intuitive Justification and a Simplified Implementation of the MAP Decoder for Convolutional Codes," *IEEE Journal on Selected Areas in Communications*, vol. 16, No. 2, Feb. 1998, pp. 261-264.

Wolf, J., "On Codes Derivable from the Tensor Product of Check Matrices," *IEEE Transactions on Information Theory*, Apr. 1965, pp. 281-284.

Wolf et al., An Introduction to Tensor Product Codes and Applications to Digital Storage Systems, *2006 IEEE Information Theory Workshop*, pp. 6-10.

Wu, Z., "Coding and Iterative Detection for Magnetic Recording Channels," *The Kluwer International Series in Engineering and Computer Science*, 1999, pp. 1-152.

Wu, Z., "Coding, Iterative Detection and Timing Recovery for Magnetic Recording Channels," A Dissertation submitted to the Department of Electrical Engineering and the Committee on Graduate Studies of Stanford University, Aug. 1999, pp. 1-143.

Wymeersch, H., "Log-domain decoding of LDPC codes over $GF(q)$," *IEEE Communications Society*, 2004, pp. 1-5.

Chaichanavong, P., et al., "A Tensor-Product Parity Code for Magnetic Recording," pp. 1-3 Feb. 2006.

Forney, G. David, "Codes on Graphs: Normal Realizations" *IEEE Transactions on Information Theory*, vol. 47, No. 2, Feb. 2001, pp. 520-548.

Gallager, R., "Low-Density Parity-Check Codes," 1963, pp. 1-90.

Hagenauer, J., et al., "A Viterbi Algorithm with Soft-Decision Outputs and its Applications," IEEE, 1989, pp. 1680-1686.

Kschischang, F., et al., "Factor Graphs and the Sum-Product Algorithm," *IEEE Transactions on Information Theory*, vol. 47, No. 2, Feb. 2001, pp. 498-519.

Lee, L.H.C., "Computation of the Right-Inverse of G(D) and the Left-Inverse of H'(D)," *Electronics Letters*, vol. 26, No. 13, Jun. 21, 1990, pp. 904-906.

Li, Z., "Efficient Encoding of Quasi-Cyclic Low-Density Parity-Check Codes," *IEEE Transactions on Communications*, vol. 54, No. 1, Jan. 2006, pp. 71-81.

MacKay, D., "Good Error-Correcting Codes Based on Very Sparse Matrices," *IEEE Transactions on Information Theory*, vol. 45, No. 2, Mar. 1999, pp. 399-431.

Öberg, M., et al., "Parity Check Codes for Partial Response Channels," *Global Telecommunications Conference—Globecom '99*, 1999, pp. 717-22.

Richardson, T., et al, "The Renaissance of Gallager's Low-Density Parity-Check Codes," *IEEE Communications Magazine*, Aug. 2003, pp. 126-131.

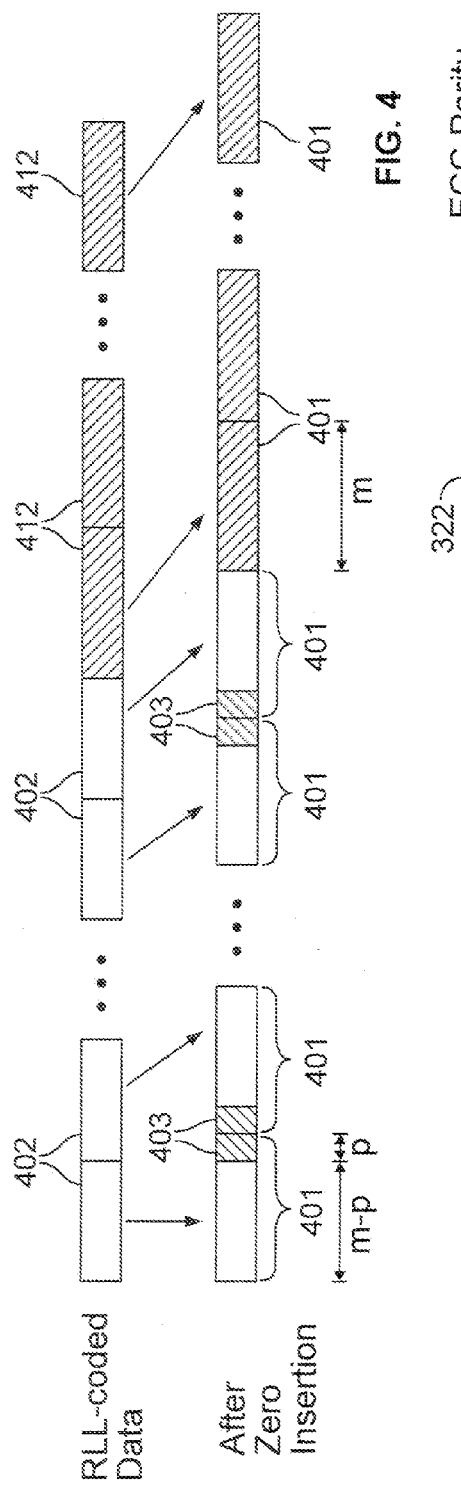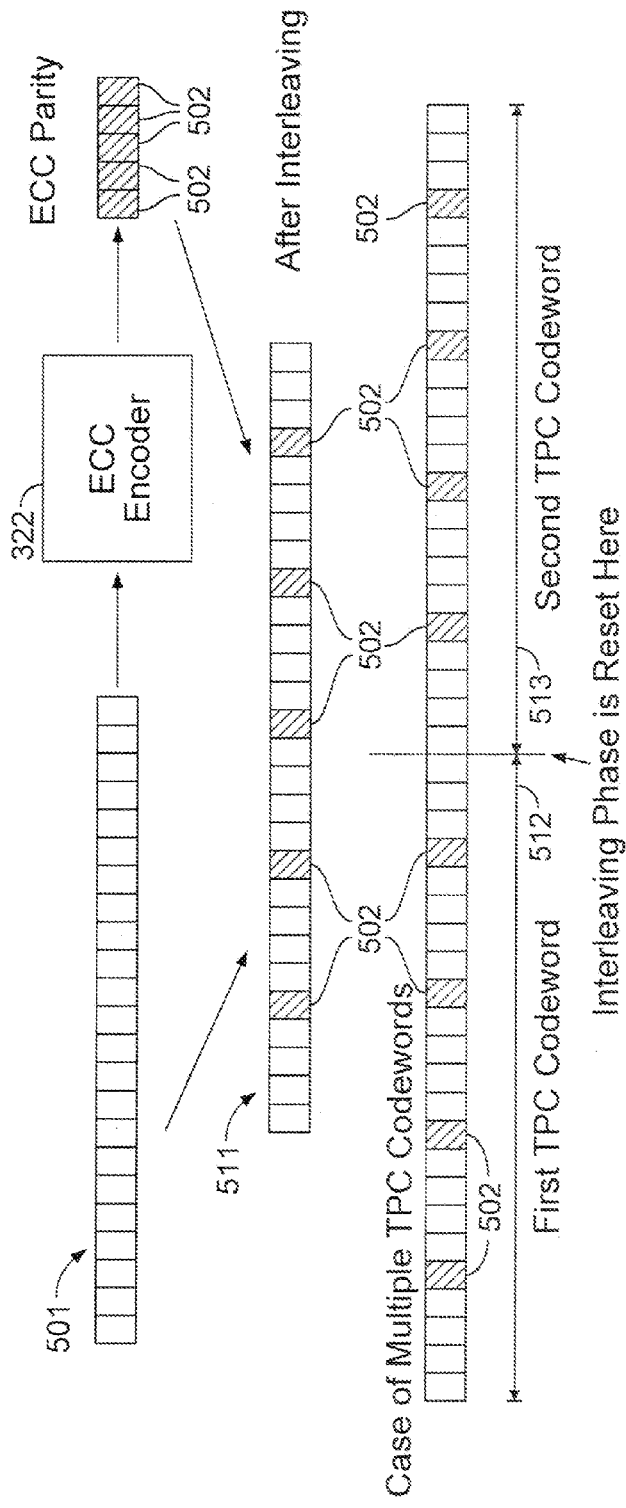

MULTI-PARITY TENSOR-PRODUCT CODE FOR DATA CHANNEL

CROSS REFERENCE TO RELATED APPLICATION

This is a continuation of copending, commonly-assigned U.S. patent application Ser. No. 12/604,558, filed Oct. 23, 2009, now U.S. Pat. No. 8,321,769, which claims the benefit of, and was copending with, commonly-assigned U.S. Provisional Patent Application No. 61/112,066, filed Nov. 6, 2008, each of which is hereby incorporated by reference herein in its respective entirety.

BACKGROUND

Embodiments of the invention generally pertain to apparatus and methods for processing streams of user data for applications including data recording and data communication. In particular, embodiments of the invention pertain to apparatus and methods for encoding and decoding streams of data.

Linear block codes, such as Single Parity Check (SPC) codes, have found wide-spread application in areas such as magnetic recording and data communications in recent years. Such codes are often used with a Viterbi detector, which provides a coding gain by using a constraint associated with the code to remove certain data sequences from being considered as possible decodings of a received data stream. As used herein, the term "coding gain" refers to the ability of a code to lessen the occurrences of errors associated with communication and/or storage of information. The performance of such a detector generally improves when linear block codes with shorter input block lengths are used. However, codes with shorter input block lengths tend to require higher overhead, thus reducing the code rate and resulting in a performance tradeoff of coding gain versus code rate penalty. As used herein, "code rate penalty" refers to a measure (e.g., a ratio) of an amount of user data relative to an amount of extra coding information that is associated with the user data. Extra coding information may be used to detect and/or correct errors that may occur in user data. This extra coding information is commonly referred to as "redundant information/data" or "parity information/data."

Tensor-Product Codes (TPC) allow the use of shorter input block lengths without the full code rate penalty typically associated with such block lengths. Accordingly, there is a continued interest in improving the performance of TPC-based encoding and decoding systems.

SUMMARY

An embodiment of an encoder apparatus includes a receive module that receives a data stream, a parity generation module that generates a plurality of parity bits based on the data stream and a word of a tensor-product code, and a parity insertion module that combines the plurality of parity bits and the data stream to generate encoded bits.

An embodiment of an encoding method includes receiving a data stream, generating a plurality of parity bits based on the data stream and a word of a tensor-product code, and combining the plurality of parity bits and the data stream to generate encoded bits.

An embodiment of a decoder apparatus includes a detector receiving and outputting encoded data, a first decoder generating first log-likelihood ratios from the encoded data, an error recovery module generating second log-likelihood ratios from the encoded data, a second decoder that derives syndrome data from the first and second log-likelihood ratios, a post-processor that combines data from the first decoder with error events from the error recovery module to generate corrected data, the post-processor further identifying a plurality of parity bits in the corrected data and replacing each of those parity bits with zero.

An embodiment of a decoding method includes detecting and outputting encoded data, generating first log-likelihood ratios from the encoded data generating second log-likelihood ratios based on error events in the encoded data, deriving syndrome data from the first and second log-likelihood ratios, combining data with error events to generate corrected data, and identifying a plurality of parity bits in the corrected data and replacing each of the parity bits with zero.

BRIEF DESCRIPTION OF THE DRAWINGS

Further features of the invention, its nature and various advantages, will be apparent upon consideration of the following detailed description, taken in conjunction with the accompanying drawings, in which like reference characters refer to like parts throughout, and in which:

FIG. 4 shows an example of zero pre-insertion in accordance with an embodiment of the present invention;

FIG. 5 shows an example of ECC parity interleaving;

DETAILED DESCRIPTION

Figure 1:
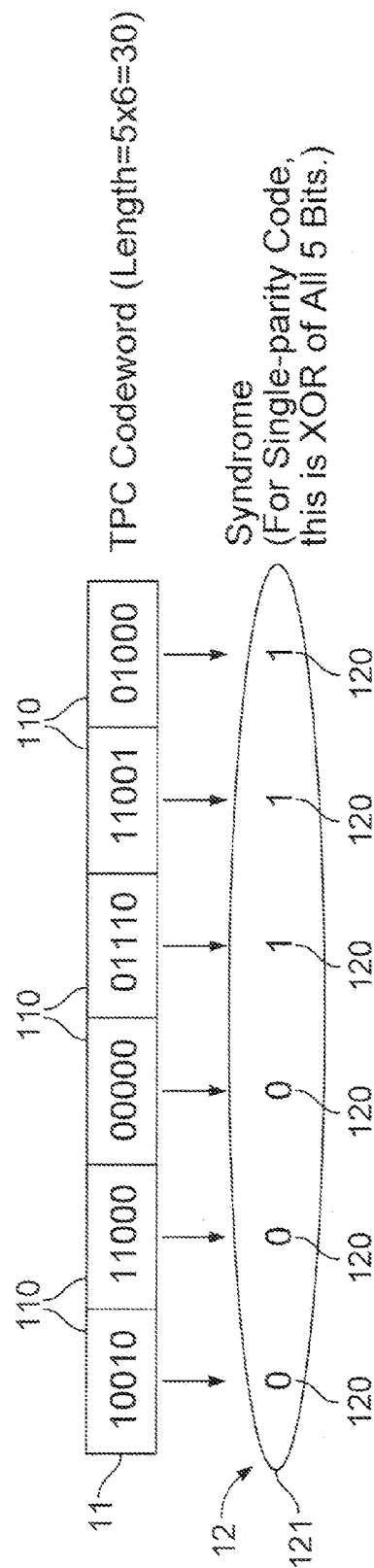
FIG. 1 shows the derivation of a single-parity tensor product code from a data stream.

A tensor-product code (TPC) includes an inner code and outer code. One property of a TPC codeword is that the syndromes of multiple codewords of the inner code form a codeword of the outer code. For example, as shown in FIG. 1, a TPC may include single-parity code 12 as the outer code and low-density parity-check (LDPC) code 11 as the inner code. It will be recognized that other types of codes may be used as the inner and outer codes. A single-parity TPC is described in copending, commonly-assigned U.S. patent application Ser. No. 11/449,066, filed Jun. 7, 2006, which is hereby incorporated by reference herein in its entirety.

In this example, the length of each codeword 110 in inner code 11 is five. A single syndrome bit 120 is derived from each codeword 110 and the syndrome bits 120 of six inner codewords 110 are used as the user bits of a single outer codeword 121 of user-length six. It will be recognized that other lengths may be used for both the inner and outer codewords.

This single-bit TPC example may be considered to be a special case of a more generic multi-parity TPC, and both single- and multi-parity codes can be used within a single channel. In a multi-parity TPC, two or more syndrome bits are derived from each codeword of the inner code.

Characteristics of the inner code may be described by a parity-check matrix. An example of parity-check matrix of a two-bit ("dibit") inner code is the following:

$$H_2 = \begin{bmatrix} 1 & 0 & 1 & 0 & 1 & 0 & 1 & 0 & 1 & 0 \\ 0 & 1 & 0 & 1 & 0 & 1 & 0 & 1 & 0 & 1 \end{bmatrix}$$

This assumes that the block length is 12, but it is straightforward to generalize to other block lengths.

The two syndrome bits, $s_0$ and $s_1$, are obtained by multiplying this 2×12 matrix with a 12×1 block vector $a_{11} \ldots a_0$:

$s_0 = a_{11} + a_9 + a_7 + a_5 + a_3 + a_1$ $s_1 = a_{10} + a_8 + a_6 + a_4 + a_2 + a_0$ where, for two binary digits x, y, x+y represents an exclusive-OR of x and y.

Figure 2:
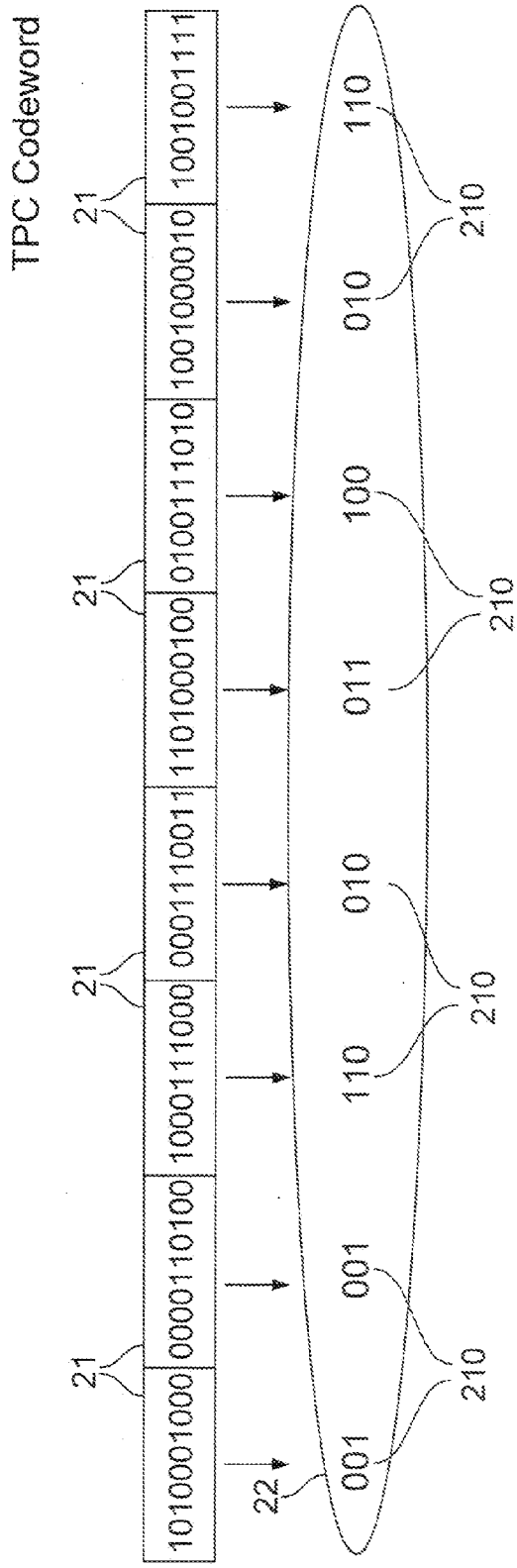
FIG. 2 shows the derivation of a tribit tensor product code.

FIG. 2 shows the derivation of a tribit outer code 22 from a series of 10-bit inner code codewords 21 having three syndrome bits 210.

An example of parity-check matrix of a three-bit ("tribit") inner code is the following:

$$H_3 = \begin{bmatrix} 1 & 0 & 0 & 0 & 1 & 0 & 0 & 0 & 1 & 0 & 0 & 0 \\ 0 & 1 & 0 & 1 & 0 & 1 & 0 & 1 & 0 & 1 & 0 & 1 \\ 0 & 0 & 1 & 0 & 0 & 0 & 1 & 0 & 0 & 0 & 1 & 0 \end{bmatrix}$$

If this 3×12 matrix is multiplied by a 12×1 block vector $a_{11} \ldots a_0$ representing an inner code codeword, the result would be three syndrome bits $s_0$, $s_1$ and $s_2$:

$s_0 = a_{11} + a_7 + a_3$ $s_1 = a_{10} + a_8 + a_6 + a_4 + a_2 + a_0$ $s_2 = a_9 + a_5 + a_1$

The parity-check matrices $H_2$ and $H_3$ can be designed for flexibility in the length of the inner codeword. For example, the same matrix can be adapted for a 10-bit codeword by deleting the last two columns.

The matrices shown above are only exemplary, and any full-rank matrix can be chosen as a parity-check matrix of an inner code. Moreover, number of syndrome bits is not limited to 1, 2, or 3, but can be any number.

Figure 3:
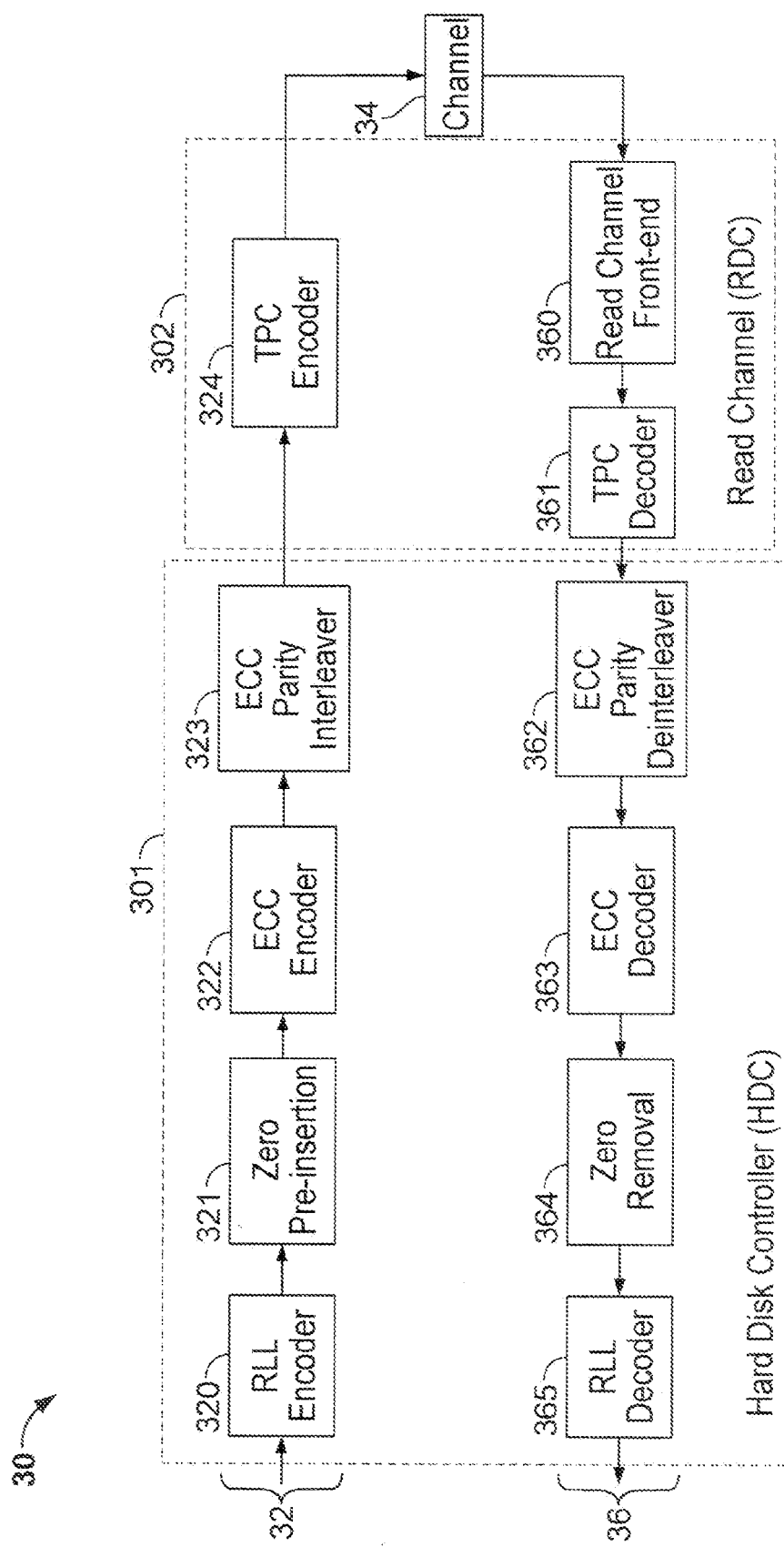
FIG. 3 is a diagram of a data channel in accordance with an embodiment of the present invention.

A data channel 30 in which the present invention can be implemented is shown in FIG. 3. As shown, this channel may be data storage channel in, e.g., a hard disk drive. However, channel 30 may be any data storage or transmission channel. A similar channel is described in connection with a single-parity tensor-product code in copending, commonly-assigned, U.S. patent application Ser. No. 11/809,670, filed Jun. 1, 2007, which is hereby incorporated by reference herein in its entirety.

Channel 30 includes an encoder write/transmit path 32, a channel medium 34 and a decoder read/receive path 36, which may be referred to as tensor-product encoder and decoder paths. Data is encoded via the encoder path 32, stored on or transmitted through the channel medium 34, and read or received and decoded via the decoder path 36.

The encoder path 32 may include encoder stage 320, zero pre-insertion stage 321, error-correcting code (ECC) encoder 322, an ECC parity interleaver 323 and a TPC encoder 324. Encoder stage 320 may be a run-length-limited encoder, which prevents long runs without transitions, and can enforce some other constraints, such as direct current (DC) limited constraints. Parity pre-insertion or zero pre-insertion stage 321 divides the data stream into concatenated segments, such as data1 and data2, respectively, by inserting dummy zeroes between them. The zeroes may be inserted into locations reserved for TPC redundancy bits, as discussed below. The stages through the ECC parity interleaver 323 may be located in the drive controller 301, while TPC encoder 324 may be located in the physical channel interface 302 itself.

The ECC encoder 322 may be an encoder operating under any suitable error correction encoding scheme, such as, e.g., systematic Reed-Solomon (RS) Code encoding. ECC encoder 322 may be followed by the ECC parity interleaver 323, which operates to interleave parity bits within the ECC-encoded data, as described in more detail below.

TPC encoder 324 may operate like that described in above-incorporated application Ser. No. 11/809,670, and is described in more detail below.

The decoder path 36 includes a read channel analog front end 360, a TPC decoder 361, an ECC parity deinterleaver 362, an ECC decoder 363, a zero-removal stage 364 and a decoder stage 365 which may be a run-length-limited decoder. Analog front end 360 and TPC decoder 361 may be located in the physical channel interface 302 itself with the remaining decoder stages being in the drive controller 301.

Read channel analog front end 360 may include an analog-to-digital converter, and a digital filter, such as a finite impulse response (FIR) filter. TPC decoder 361 may be that described in above-incorporated application Ser. No. 11/809,670, and described in more detail below.

Zero pre-insertion stage 321 inserts dummy bits into the RLL-coded data, to reserve locations for TPC parity bits to be inserted later. Although zero pre-insertion may not be necessary (with the TPC parity bits being inserted later), it may be advantageous to perform zero pre-insertion. Without zero pre-insertion, the block length of the TPC inner code may not be uniform, resulting in a decoder with higher complexity to compensate. And even with the more complex decoder, the block boundaries will not necessarily correspond to ECC symbol boundaries, thus affecting performance.

FIG. 4 shows an example of zero pre-insertion according to an embodiment of the invention, as described in above-incorporated application Ser. No. 11/809,670 for the case where the number of parity bits is 1. In this example, the size of each ECC symbol 401, including parity bits, is m, the number of parity bits is p, and the size of a block 402 of the RLL-encoded data is m-p. As shown, for each block 402 of RLL-encoded data, p zeroes 403 are inserted. Zeroes might not be inserted into user data blocks 412, which start out, and remain, at size m.

As stated above, the size of each RLL-encoded block 402 may not be same, so p may differ for different blocks. Moreover, the location of the inserted zeroes 403 may not be the same for every block. In the example shown, the location of inserted zeroes 403 alternate between the beginning and the end of successive blocks, but that is not necessary. However, the number and locations of inserted zeroes 403 are monitored if those numbers and positions are not always the same.

ECC parity interleaver 323, also described in above-incorporated application Ser. No. 11/809,670, spreads ECC parity throughout entire sector. As diagrammed in FIG. 5, when an original sector 501 of data is encoded by ECC encoder 322, a plurality of parity bits 502 is generated, which are concatenated with sector 501 to create a longer sector 511. In order to be useful, those ECC parity bits 502 should be spread throughout sector 511 rather than being grouped together in one place within sector 511. Preferably, ECC parity bits 502 are distributed uniformly. However, TPC encoder 324 has to be able to identify which bits are the ECC parity bits to prevent it from trying to replace those bits with TPC parity bits. Therefore, in one embodiment, ECC parity bits 502 are always in the same place in sector 511. To that end, although ECC parity bits 502 may be uniformly spaced within a given codeword 512, 513, the "interleaving phase" may be reset when a new codeword 512, 513 is started, so that the next ECC parity bit 502 to be interleaved is uniformly spaced from the beginning of the current codeword, rather than from the previous parity bit 502.

Figure 6:
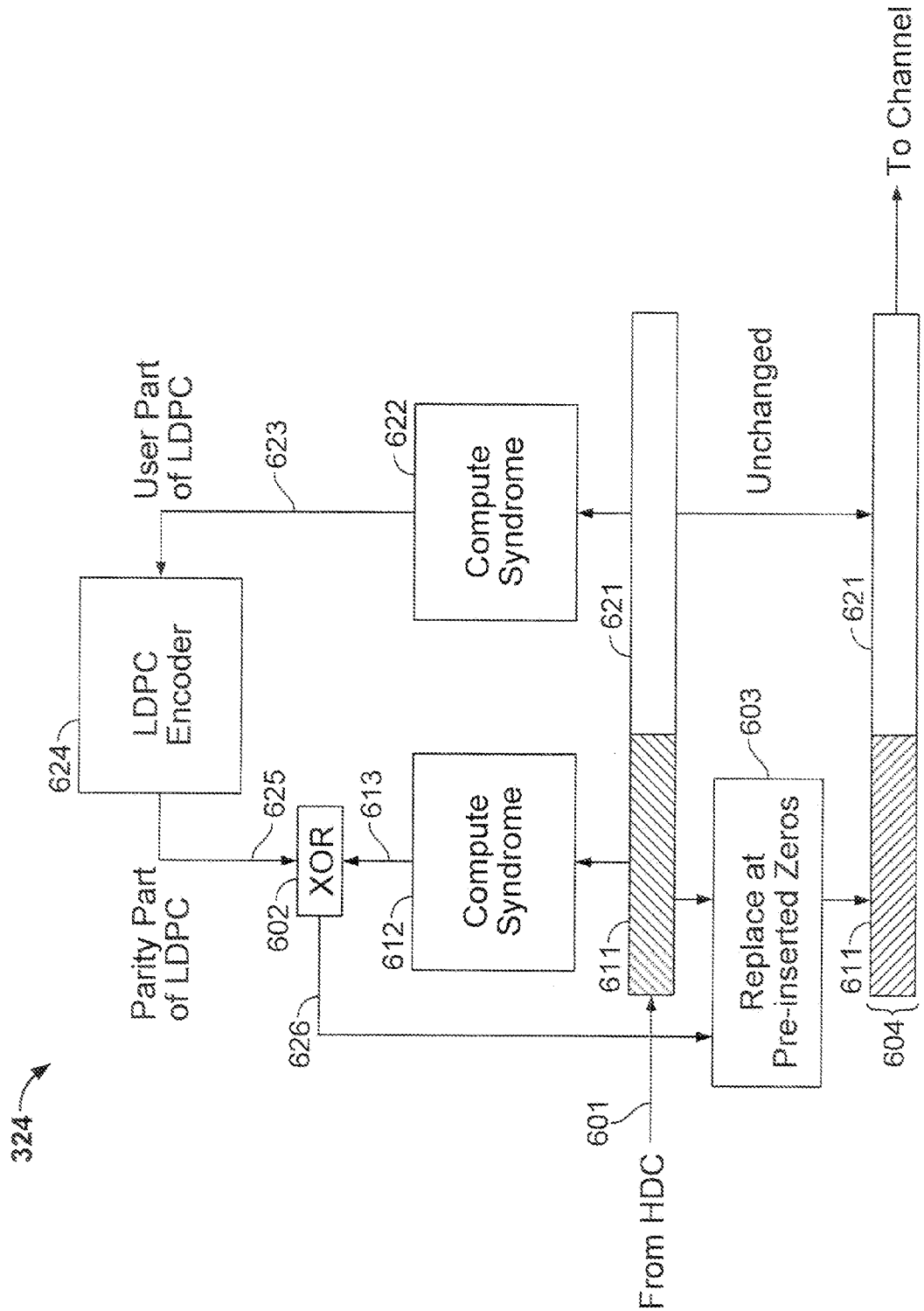
FIG. 6 is a diagram of a TPC encoder in accordance with an embodiment of the present invention.

FIG. 6 shows a simplified diagram of TPC encoder 324. Incoming data 601 preferably has been processed through encoder stage 320, zero pre-insertion stage 321, ECC encoder 322, and ECC parity interleaver 323, and includes a parity portion 611 to which zeroes have been pre-inserted, and a user portion 621 without pre-inserted zeroes. At 622, syndrome bits are derived from user portion 621 using the parity-check matrices as described above, and those user portion syndrome bits 623 are input to an LDPC encoder 624 to generate LDPC parity bits 625. At 612, syndrome bits 613 are derived from parity portion 611 using the parity-check matrices as described above, and those parity portion syndrome bits 613 are exclusively-ORed at 602 with LDPC parity bits 625 to generate parity bits 626 which are then substituted at 603 for the pre-inserted zeroes 403 in parity portion 611. Data 604—including parity portion 611 with LDPC parity bits 626, and user portion 621—are then passed to data channel 30.

Figure 7:
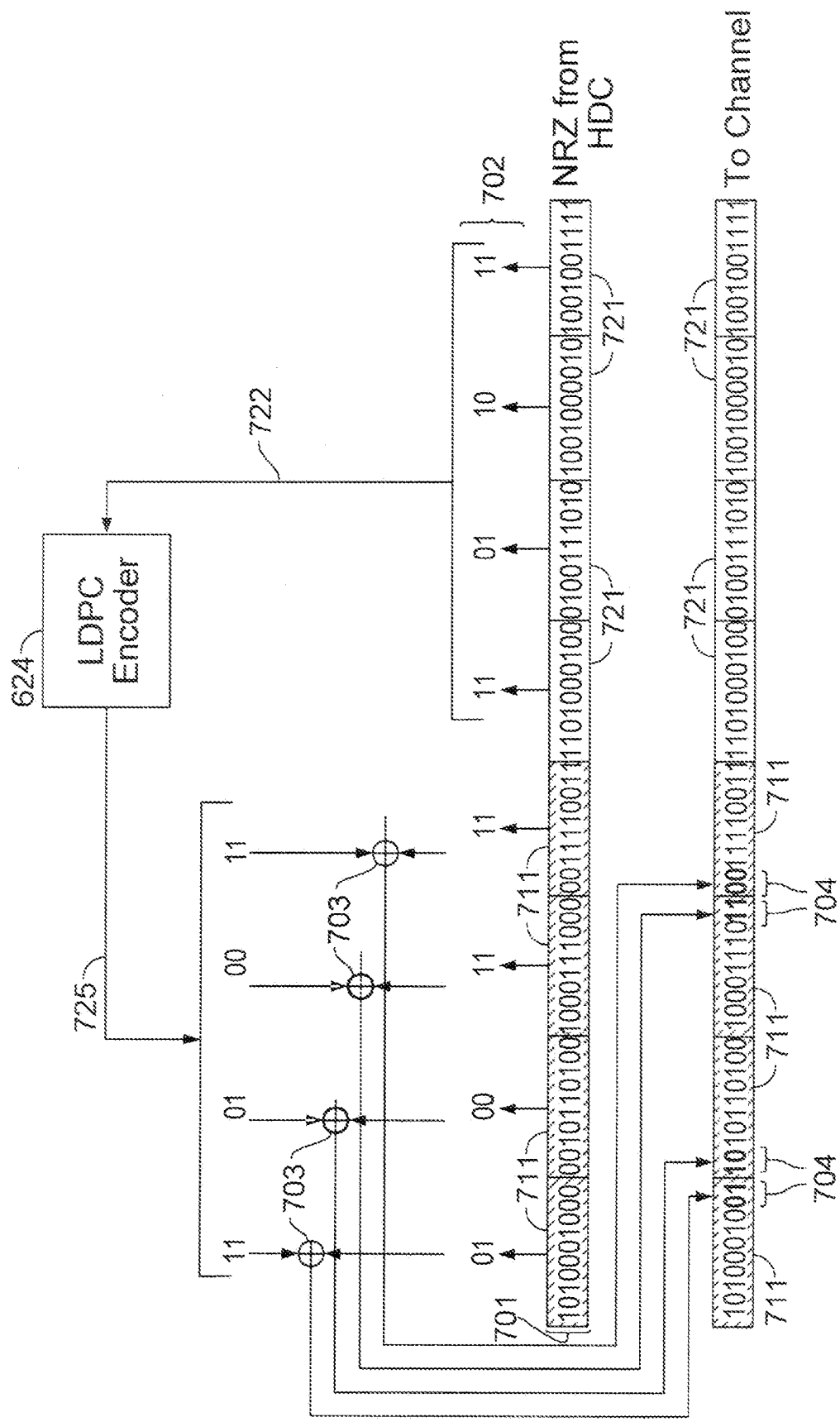
FIG. 7 is an example of dibit encoding in accordance with an embodiment of the present invention.

FIG. 7 is a "dibit" example of the foregoing using 10-bit inner codewords and outer codewords formed by deriving two parity bits from each inner codeword. Data 701 from the ECC encoder includes parity symbols 711 with zeroes pre-inserted, and user data symbols 721 which have not been changed. Two-bit syndromes 702 ($s_1s_0$) are derived from symbols 711 and 721 using the parity-check matrices as described above. User syndromes 722 are encoded in LDPC encoder 624 to generate LDPC parity data 725, which are XORed at 703 with syndromes 702 from parity symbols 711. The results of the XOR operations 703 are replaced in parity symbols 711 in the pre-inserted zero locations. In this example, the pre-inserted zero locations 704 ($p_1p_0$) alternate between the last two bits and the first two bits in alternate symbols 711.

The exclusive-OR operation just described works when a portion of the parity-check matrix is the identity matrix. That is true of both the first two columns and the last two columns of the dibit parity-check matrix given above. However, in a tribit case, this will be true in the case of an odd block length, but for an even block length it is not possible to have a full-rank parity-check matrix that has an identity matrix as a submatrix in the last three columns. Therefore, instead of a simple XOR, the tribit encoder may operate as follows.

For those symbols where the pre-inserted zeroes are at the beginning of the block, corresponding to a 3-by-3 identity submatrix in the first three columns of the parity matrix, the XOR operation as in FIG. 7 provides three parity bits $p_2p_1p_0$. For those symbols where the pre-inserted zeroes are at the end of the block, then in a case where the block length is 2 mod 4, and the ECC-encoded symbol, with three pre-inserted zeroes, is $a_9a_8a_7a_6a_5a_4a_3000$, one can define the desired output as $a_9a_8a_7a_6a_5a_4wxyz$, where:

$$w=a_7+s_2=a_3+p_2$$

$$x=a_5+a_4+a_3$$

$$y=a_9+a_5+s_0=p_0$$

$$z=a_8+a_6+s_5+a_3+s_1=x+p_1$$

In a case where the block length is 0 mod 4, and the ECC-encoded symbol, with three pre-inserted zeroes, is $a_{11}a_{10}a_9a_8a_7a_6a_5a_4a_3000$, one can define the desired output as $a_{11}a_{10}a_9a_8a_7a_6a_5a_4wxyz$, where:

$$w=a_{11}+a_7+s_0=a_3+P_0$$

$$x=a_5+a_4+a_3$$

$$y=a_9+a_5+s_2=p_2$$

$$z=a_{10}+a_8+a_6+a_5+a_3+s_1=x+p_1$$

Figure 8:
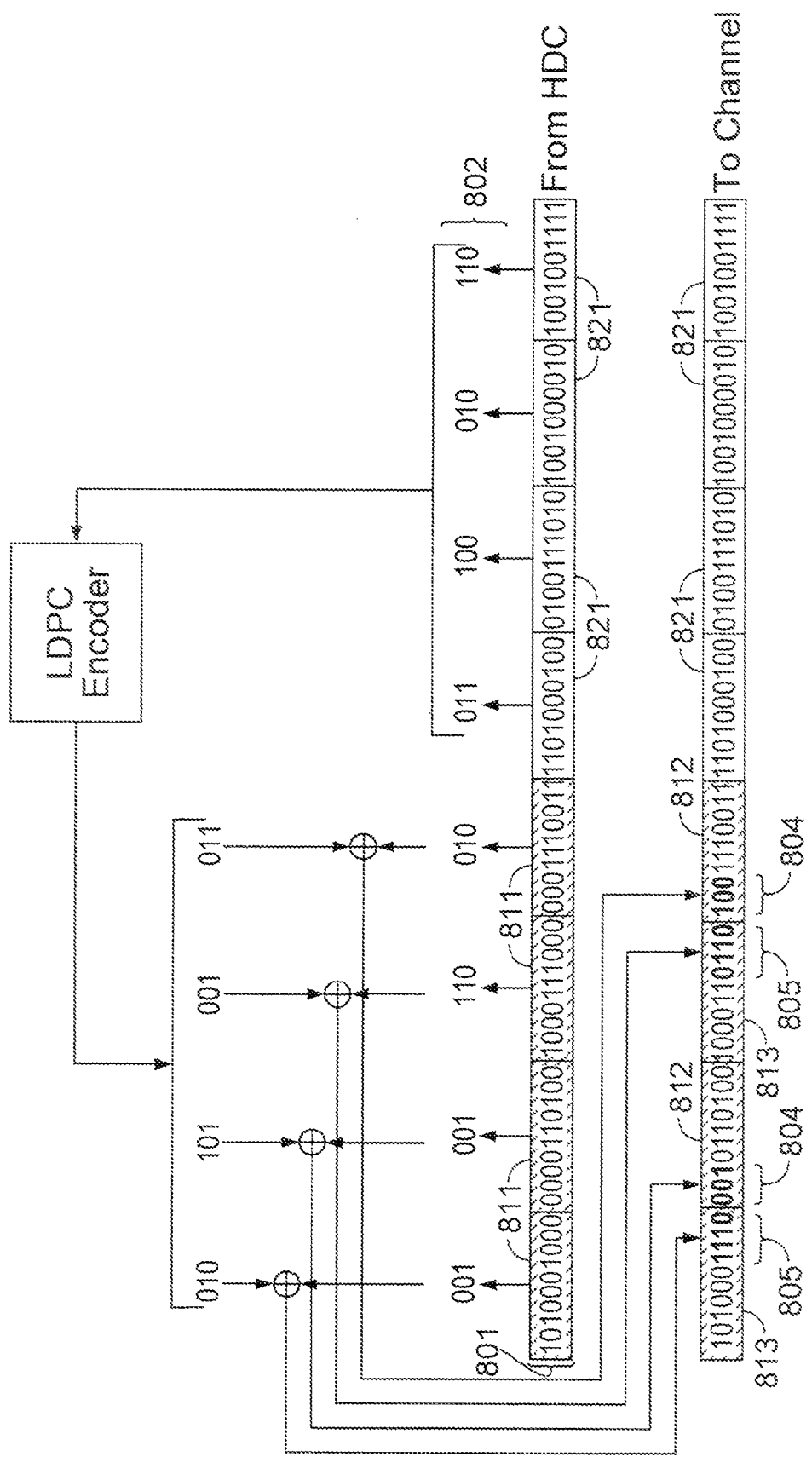
FIG. 8 is an example of tribit encoding in accordance with an embodiment of the present invention.

FIG. 8 is a "tribit" example similar to FIG. 7 using 10-bit inner codewords and outer codewords formed by deriving three parity bits from each inner codeword. Data 801 from the ECC encoder includes parity symbols 811 with zeroes pre-inserted, and user data symbols 821 which have not been changed. Three-bit syndromes 802 ($s_2s_1s_0$) are derived from symbols 811 and 821 using the parity-check matrices as described above. For those blocks 812 where the pre-inserted zeroes are at the beginnings of the blocks, corresponding to a 3-by-3 identity submatrix in the first column of the parity matrix, the XOR operation as in FIG. 7 provides three parity bits 804 to be substituted for the three pre-inserted zeroes.

For those blocks 813 where the pre-inserted zeroes are at the ends of the blocks, the calculations above for w, x, y and z provide four parity bits 805 to be substituted for four pre-inserted zeroes. User blocks 821 are unchanged by this process.

Figure 9:
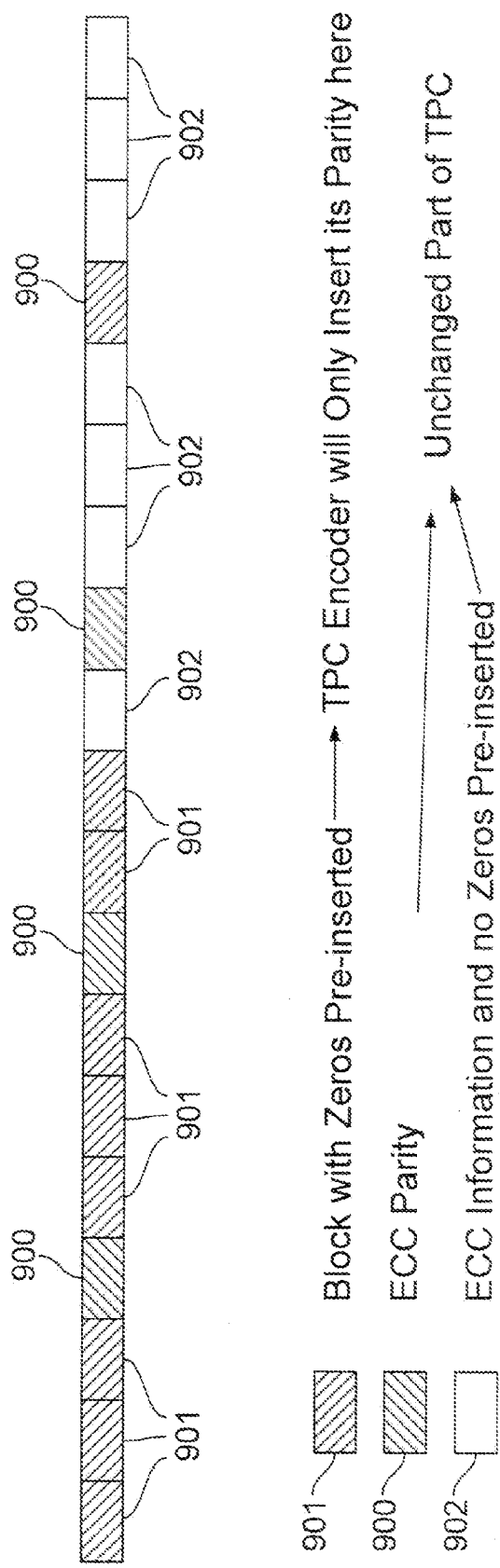
FIG. 9 is an example of ECC block interleaving.
Figure 10:
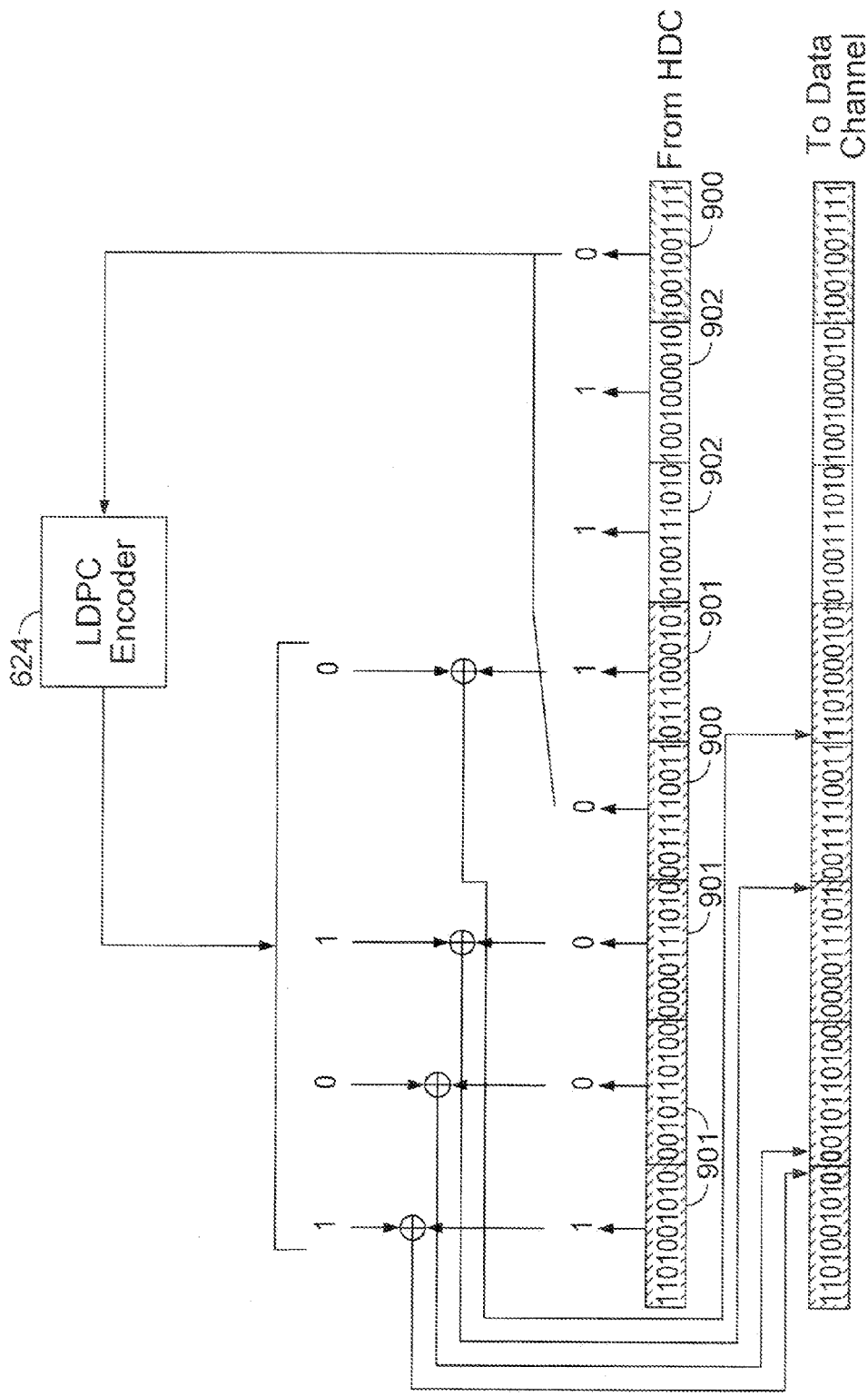
FIG. 10 is an example of encoding of ECC block-interleaved data in accordance with an embodiment of the present invention.

The TPC encoding process should insert parity bits only in blocks that have had zeroes pre-inserted because, as described above, it is desirable to maintain uniform block length. Where ECC interleaving has occurred after zero pre-insertion, ECC parity blocks 900 may be interleaved among both parity blocks 901 and user blocks 902 as shown in FIG. 9. Those ECC parity blocks 900 may be treated as user blocks, regardless of their location, for encoding purposes, and are therefore used to contribute to the user portion of the inner code. FIG. 10 shows how that is done, albeit using a one-bit parity example.

As mentioned before, a typical choice for the TPC outer code is an LDPC code. For reduced complexity, a practical LDPC code may be a "structured" code, such as a quasi-cyclic code. For such a code, with multibit parity TPC, interleaving/deinterleaving the LDPC code may improve decoder performance. Because neighboring bits are processed similarly, any degradation of one parity bit might similarly affect the other parity bits, but if the parity bits are distributed by interleaving, it is less likely that they would all be affected.

Figure 11:
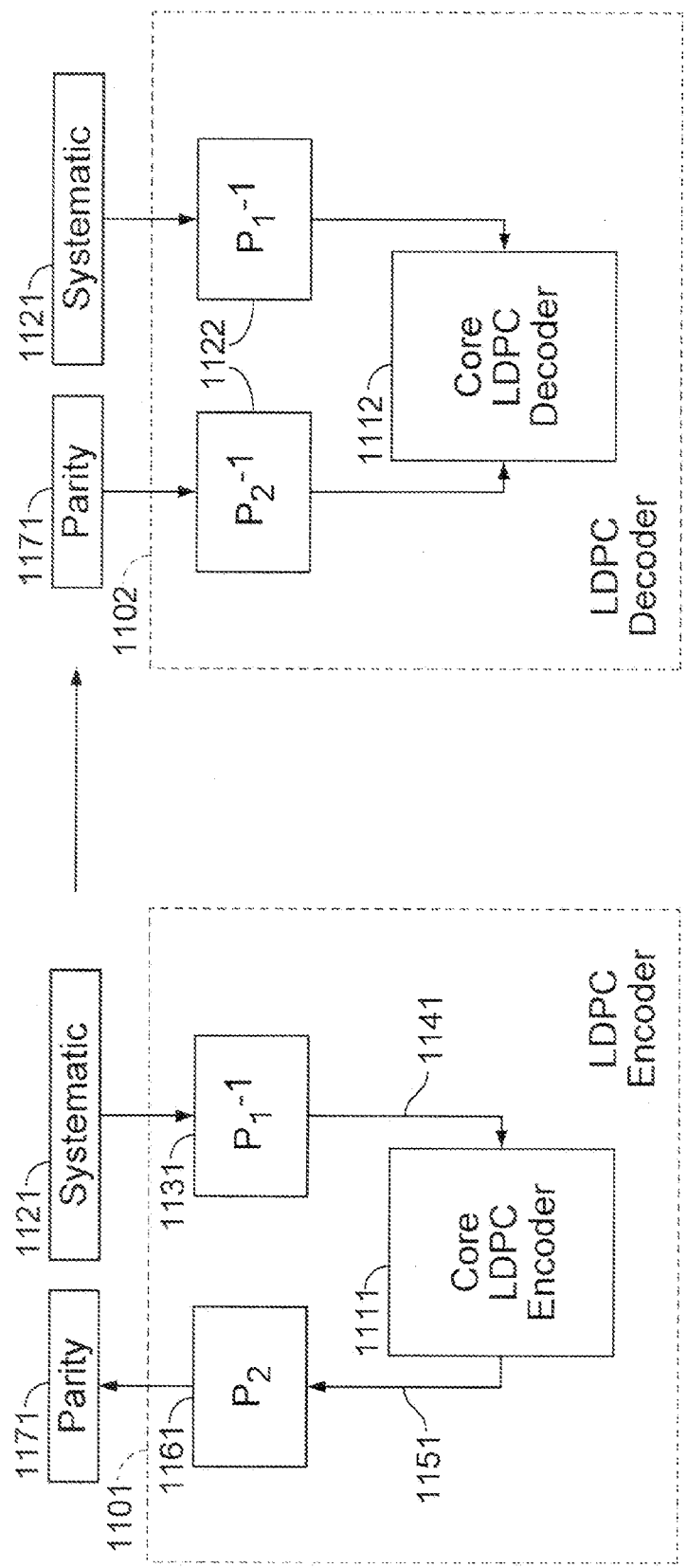
FIG. 11 is an example of interleaving and deinterleaving in a TPC encoder/decoder.

As seen in FIG. 11, where $P_1$ and $P_2$ denote interleaving of bits (in encoder 1101) and log-likelihood ratios LLRs (in decoder 1102), and $P_1^{-1}$ and $P_2^{-1}$ show deinterleaving, encoder 1101 includes a core encoding engine 1111. "Systematic," or user, symbols 1121 are deinterleaved at 1131 and deinterleaved symbols 1141 are encoded by encoding engine 1111 and the resulting parity bits 1151 are reinterleaved at 1161 to provide parity symbols 1171. When user symbols 1121 and parity symbols 1171 reach decoder 1102, LLRs are deinterleaved at 1122 from both user symbols 1121 and parity symbols 1171 before decoding in core decoding engine 1112.

Figure 12:
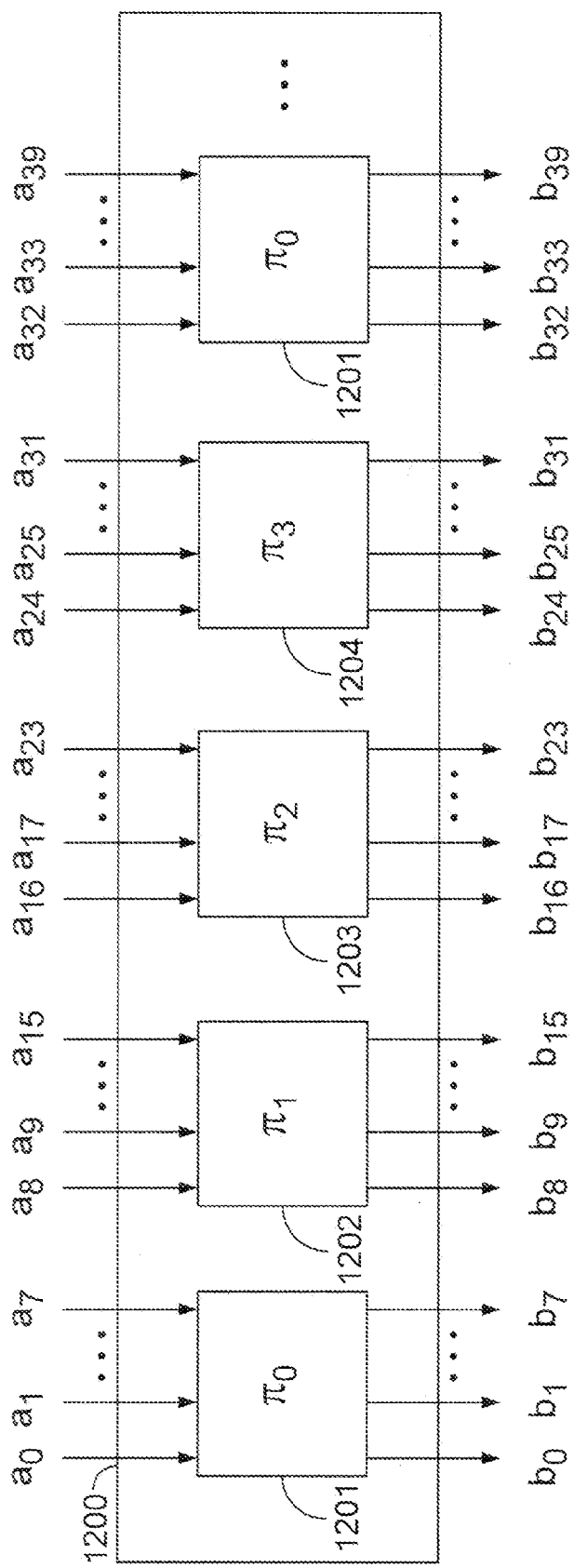
FIG. 12 is an example of an interleaver in accordance with an embodiment of the present invention.

This interleaving/deinterleaving operation was described generally in copending, commonly-assigned U.S. patent application Ser. No. 11/933,831, filed Nov. 1, 2007, which is hereby incorporated by reference herein in its entirety. A particular interleaving/deinterleaving operation may be described with reference to FIG. 12.

Although any interleaver (and corresponding deinterleaver) may be used, interleaver 1200 has low complexity and provides good performance. For simplicity, every eight bits are interleaved. There are 8! choices of interleaver functions having eight inputs and eight outputs, but, again for simplicity, four such functions $n_0$ (1201), $n_1$ (1202), $n_2$ (1203), $n_3$ (1204), may be used, and repeated as necessary. The number of interleaver function blocks may be equal to the number of LDPC computation units (e.g., 12) to simplify the decoding process.

Examples of the four interleaving functions are:
{0,1,2,3,4,5,6,7,8,9,10,11}
{0,4,8,3,7,11,6,10,2,9,1,5}
{0,7,11,3,10,2,6,1,5,9,4,8}
{0,10,5,3,1,8,6,4,11,9,7,2}

The first interleaver is an identity. Each of the other three has four bits that are mapped to same positions: 0, 3, 6, 9. Bits are mapped within the same mod 3 locations. That is, {0,3,6,9} are swapped among themselves, as are {1,4,7,10} and {2,5,8,11}. For example, the second interleaver means that if the LDPC bits are arranged as {a,k,i,d,b,l,g,e,c,j,h,f}, then the channel parity bits are {a,b,c,d,e,f,g,h,i,j,k,l}.

Figure 13:
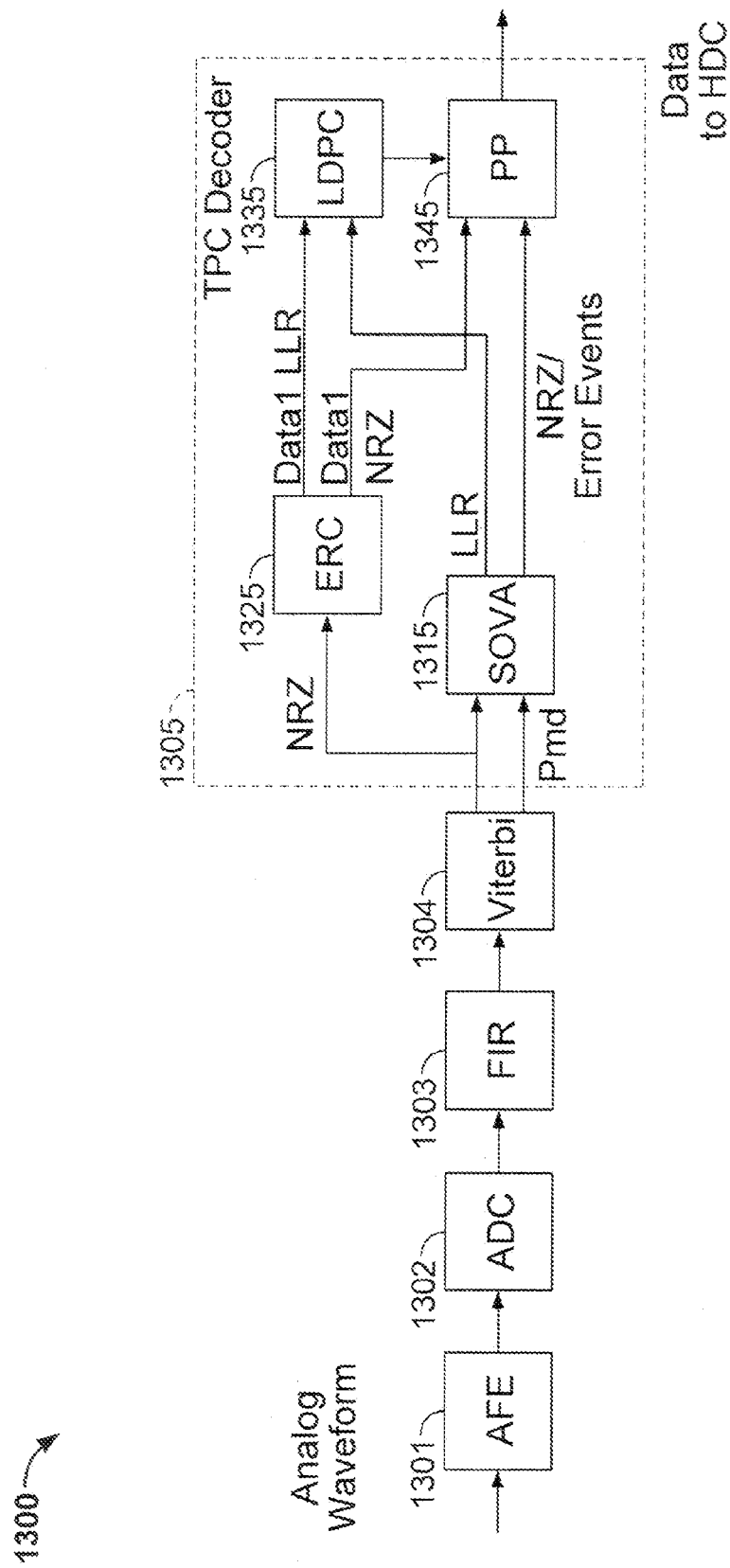
FIG. 13 is a diagram of a read channel.

As described above and shown in FIG. 13, a hard disk drive read channel 1300 may include an analog front-end (AFE) 1301, and analog-to-digital converter (ADC) 1302, a finite-impulse-response (FIR) filter 1303 functioning as an equalizer, a Viterbi detector 1304, and a TPC decoder 1305. TPC decoder 1305 in turn may include a soft-output Viterbi algorithm (SOVA) decoder 1315, an error recovery module (ERC) 1325, an LDPC decoder 1335, and a post-processor (PP) 1345.

Figure 14:
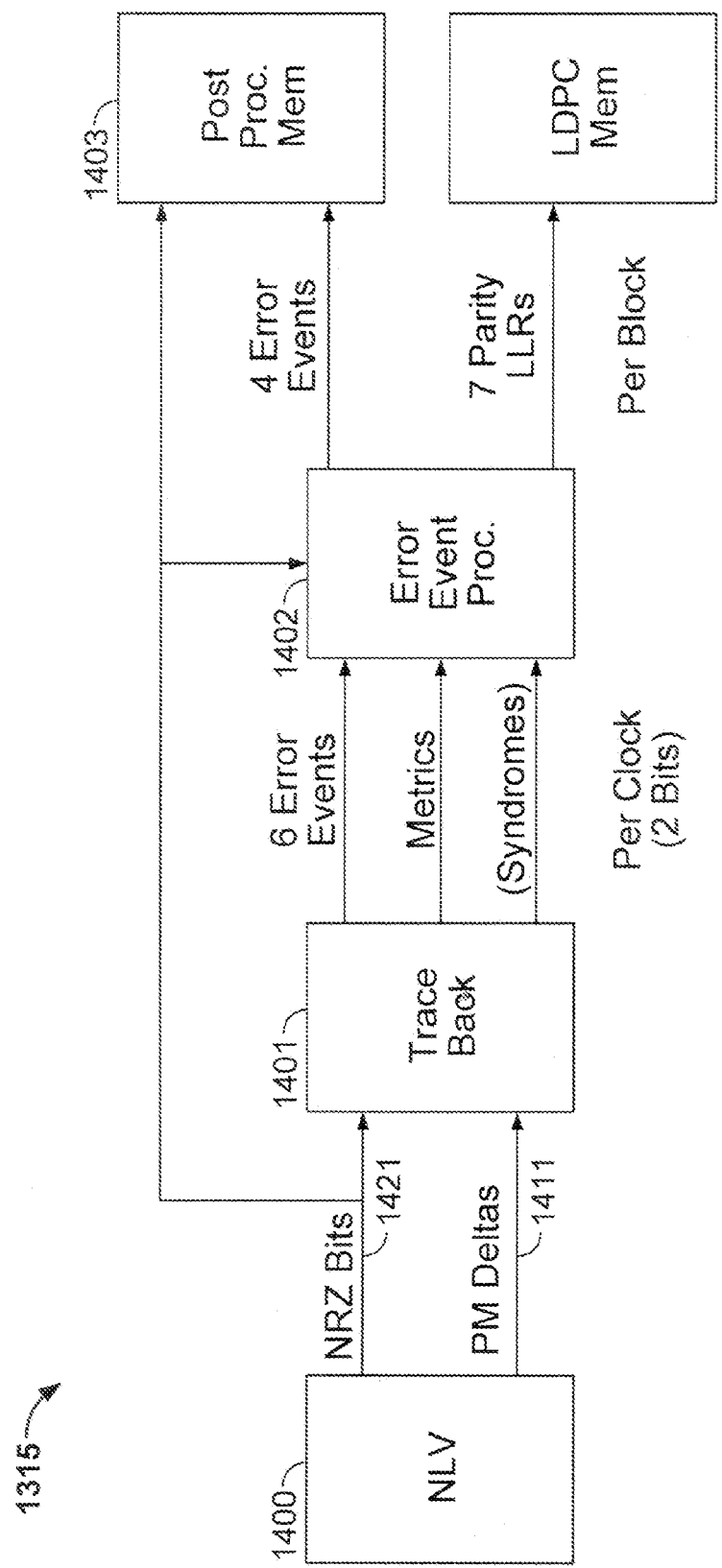
FIG. 14 is a diagram of a Soft Output Viterbi Algorithm (SOVA) decoder.

SOVA decoder 1315 may be that described in copending, commonly-assigned U.S. patent application Ser. No. 12/572,329, filed Oct. 2, 2009, which is hereby incorporated by reference herein in its entirety. Briefly, SOVA 1315, as described in FIG. 14, prepares soft information (LLRs) for LDPC decoder 1335, and prepares error events for post-processor 1345, allowing it to make corrections. SOVA 1315 may include trace-back unit 1401 and error event processor (EEP) 1402. Trace-back unit 1401 generates error events and metrics from PM deltas 1411 and NRZ bits 1421 output by Viterbi detector (NLV) 1400. EEP 1402 chooses the most likely event for each syndrome, and a second most likely event regardless of syndrome, for a total of 7+1=8 events per block. (at least in a case of up to tribit architecture). EEP 1402 also computes LLRs from seven most likely events for LDPC 1335 (at least in a case of up to tribit architecture).

EEP 1402 may store the best n events, out of the eight events that it keeps, to post processor (correction block) memory 1403. n=4 may be selected, but a larger n, which provides better performance at a cost of greater complexity, also may be selected.

Figure 15:
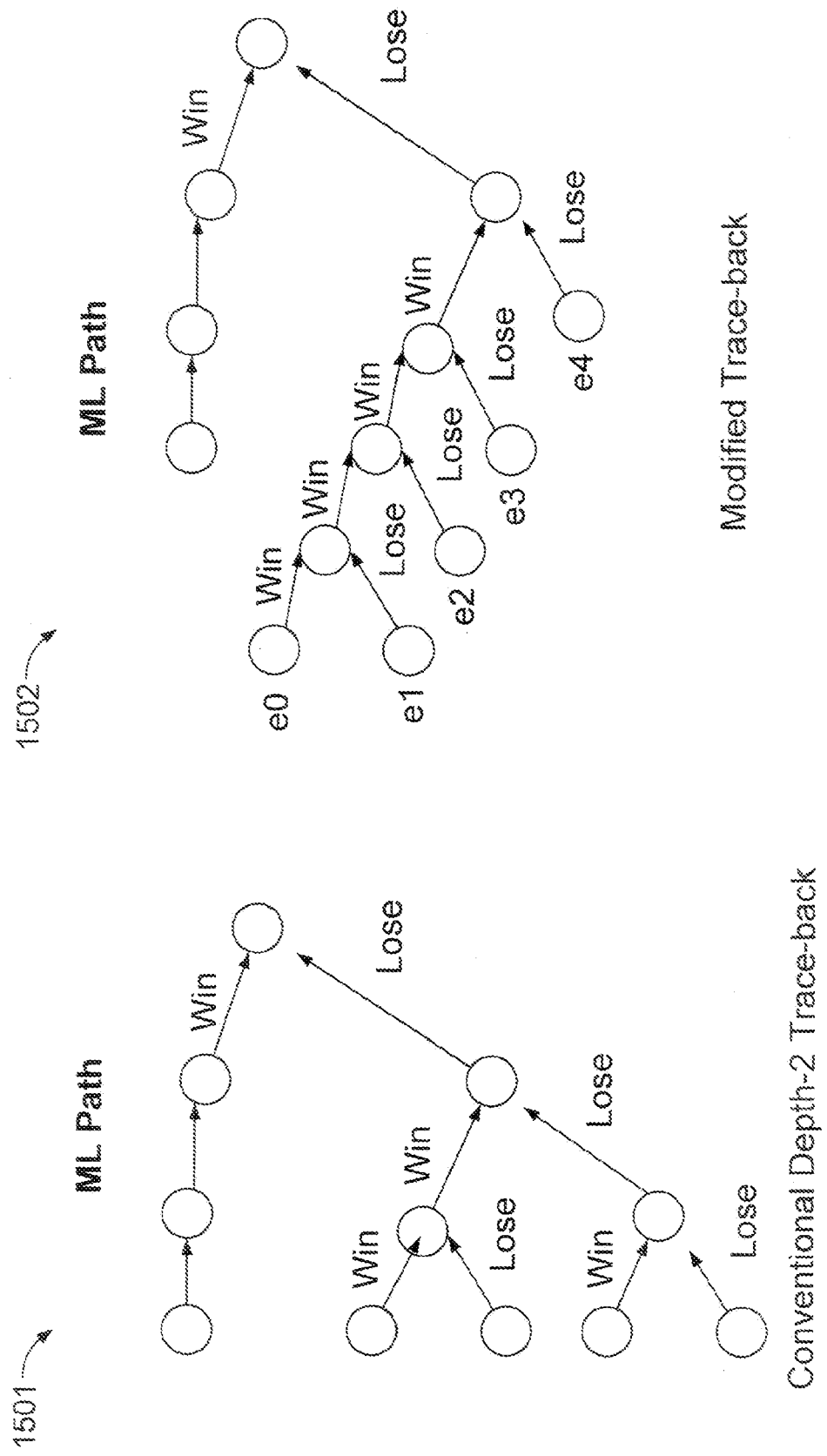
FIG. 15 compares a conventional trace-back to a modified trace-back that may be used in embodiments of the invention.
Figure 16:
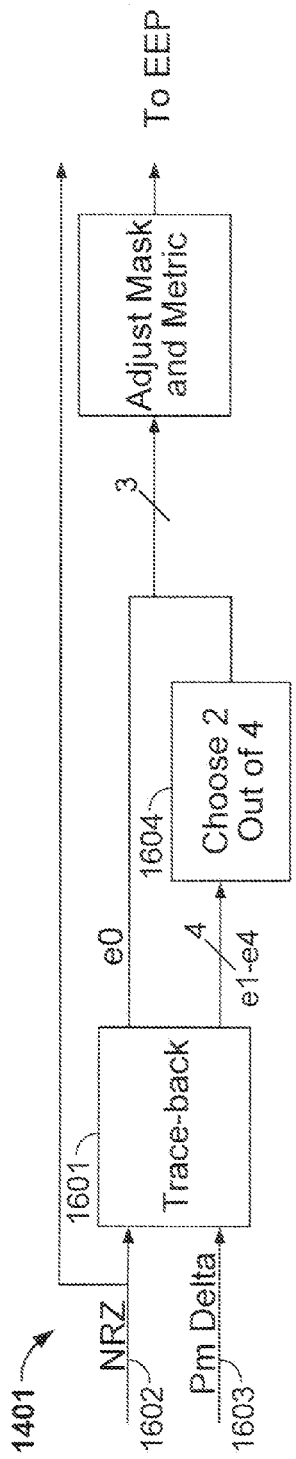
FIG. 16 shows details of an embodiment of a trace-back unit.
Figure 17:
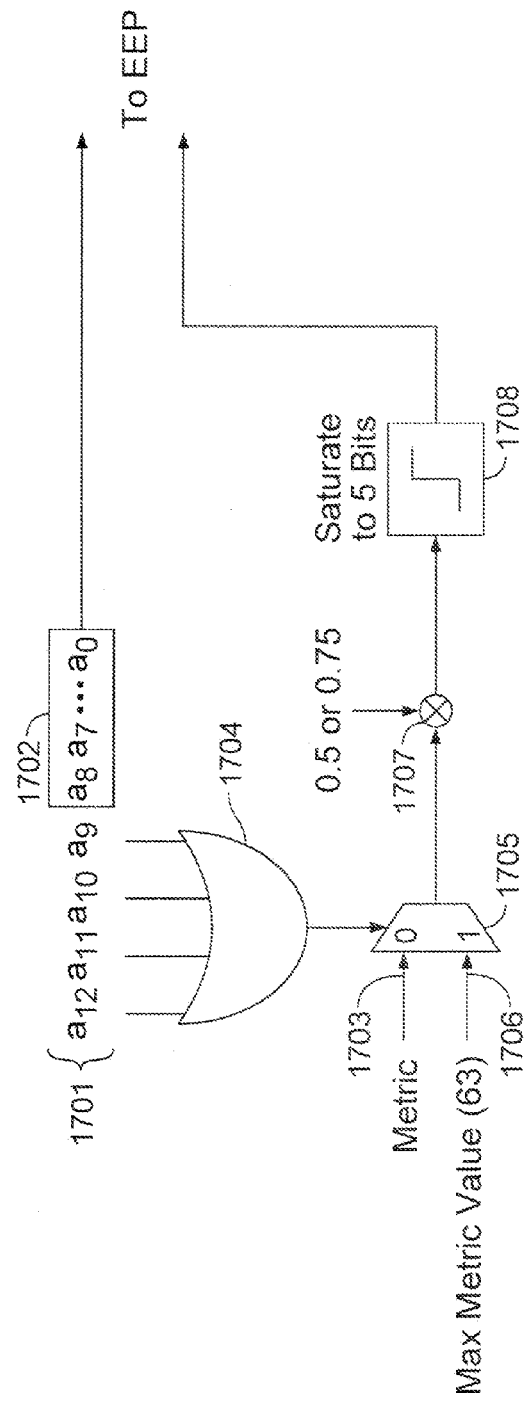
FIG. 17 shows adjustment of trace-back events output by the trace-back unit of FIG. 16.

FIG. 15 compares a conventional trace-back 1501 to a modified trace-back 1502 used by trace-back unit 1401. Unlike the tree structure of trace-back 1501, trace-back 1502 has five merged paths, and provides better performance. A functional diagram of trace-back unit 1401 is shown in FIG. 16, where, at 1601, five error events e0...e4 are computed for each NRZ bit 1602 based on PM deltas 1603. Among the five events, e0 will have the minimum metric. At 1604, trace-back unit 1401 then chooses two out of the other four events in accordance with trace-back 1502. Those two events, along with e0 and the NRZ bits, are sent to EEP 1402 after adjustment as shown in FIG. 17.

The trace-back unit initially provides a p-bit mask 1701: $a_{12}a_{11}\ldots a_0$, but only q bits are sent to EEP 1402. p and q may be 13 and 9, 12 and 8, or any other combination that differs by 4 because the number of states of Viterbi detector 1304 is $2^4=16$. A longer maximum error event provides better performance, but increases the complexity of the circuit. Most of the time, an error event is short and so in the 13-bit example, $a_{12}a_{11}a_{10}a_9=0000$. In this case, the 9-bit mask 1702 sent to EEP 1402 is correct and no adjustment of metric 1703 is needed. However, when an error event is longer than nine bits, the presence of a "1" in any one or more of $a_{12}\ldots a_9$, causes OR-gate 1704 to select, instead of the true value of metric 1703, a maximum metric value 1706 (63 in the case of a 6-bit number) at multiplexer 1705, to indicate that the 9-bit mask 1702 is not a true representation of the error event. If desired, performance can be improved by scaling the (6-bit) metric at 1707 and saturating the metric to five bits at 1708 before sending the metric to EEP 1402, to prevent all the values from being maxima or minima, or the scaling and saturation may be performed in EEP 1402 instead of trace-back unit 1401.

Figure 18:
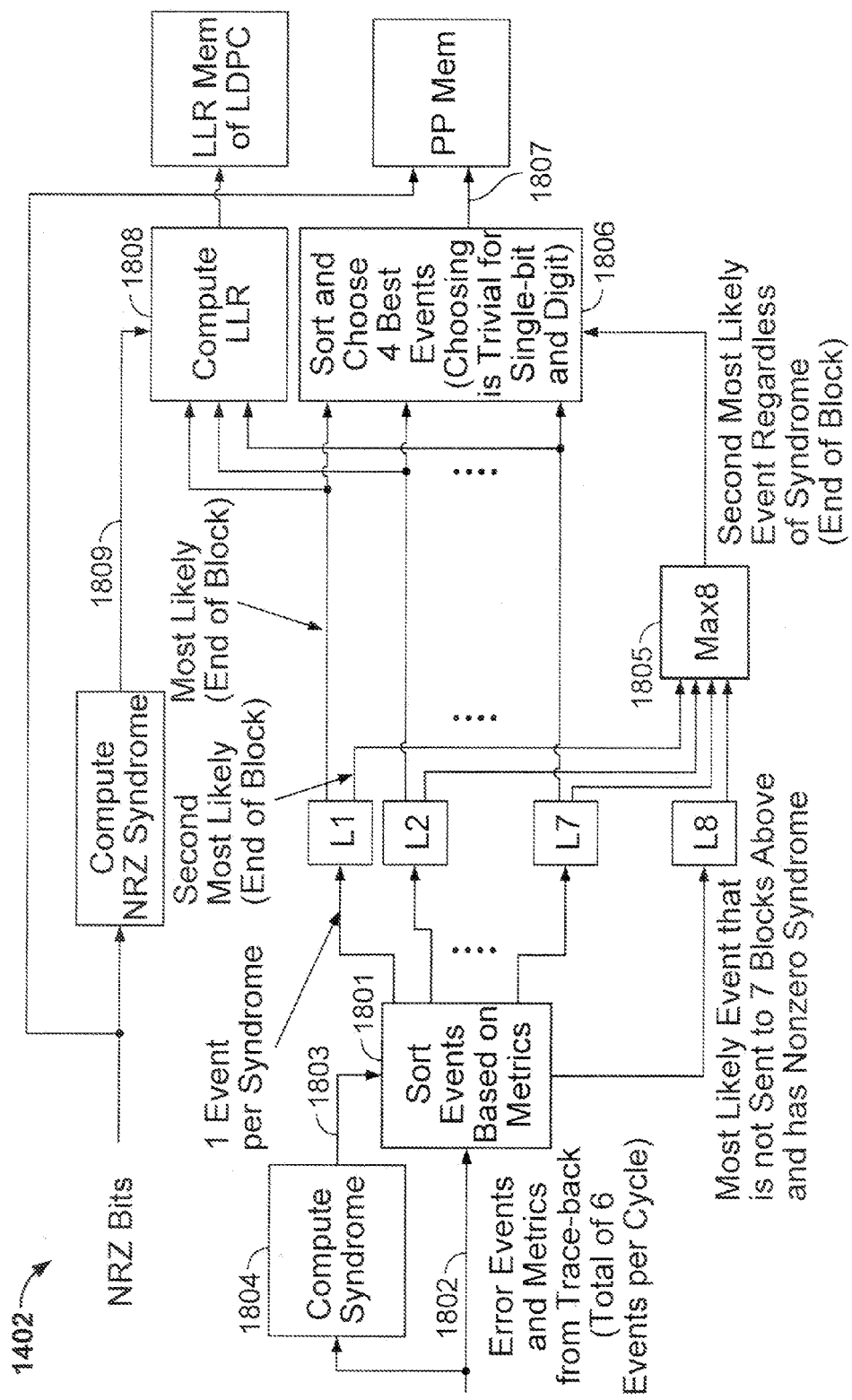
FIG. 18 shows details of an embodiment of an error event processor.

Details of an embodiment of EEP 1402 are shown in FIG. 18. The role of EEP 1402 is to select a most likely error event for each nonzero syndrome value (1-7 in a tribit parity embodiment). Those error events are used to compute LLRs. At 1801, the errors are sorted based on errors 1802 from trace-back unit 1401 and syndromes 1803 computed therefrom at 1804, and the two most likely events per syndrome are selected/kept in blocks L1-L7 (in the tribit case). Each block L1-L7 sends the most likely error to block 1806 for LLR computation, and sends the second most likely error to block 1805. The most likely event that has a nonzero syndrome but is not sent to one of blocks L1-L7 also is sent by block 1805 to block 1806. Block 1806 selects the most likely ones 1807 of its eight inputs for post-processing (four out of eight in the tribit case).

LLRs are computed at block 1808 for LDPC decoder 1335 from NRZ syndromes 1809 and error event metrics 1802 as selected by blocks L1-L7 (in the tribit case). IF $s_{nrz}$ denotes an NRZ syndrome 1809, and $M(1),\ldots,M(7)$ denotes the metrics of most likely events with syndromes $1,\ldots,7$, respectively (for convenience, one can define $M(0)=0$), then the LLR is computed by:

$$L(x)=M(s_{nrz}+x)-M(s_{nrz})$$

where x ranges from 1 to 7 and $s_{nrz}+x$ denotes the XOR of 3-bit numbers $s_{nrz}$ and x. In the case of a 5-bit error event metric, M ranges from 0 to 31. Therefore, L can range from −31 to +31.

Figure 19:
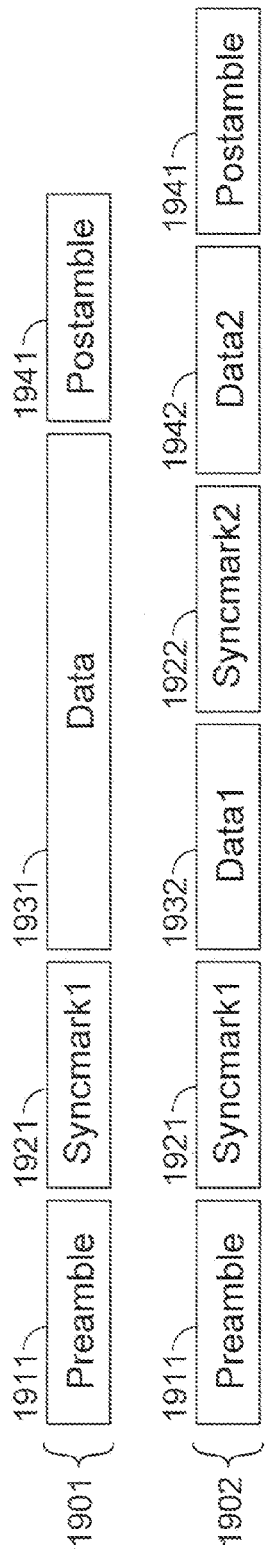
FIG. 19 shows a data structure for use with an error recovery module.

ERC module 1325 may be explained in connection with FIG. 19, which shows two frame structures. A minimal frame structure 1901 has a preamble 1911, a first sync mark (syncmark1) 1921, data 1931, and a postamble 1941. If, on reading, the syncmark detector misses syncmark1 1921, then data 1931 cannot be retrieved. To obtain higher reliability, frame structure 1902 may be used which includes a second sync mark (syncmark2) 1922 in the middle of the data, splitting the data into two portions data1 1932 and data2 1942. If, on reading, syncmark1 1921 is missed, but the receiver comes upon syncmark2 1922, it will at least be able to recover data2 1942.

The role of ERC module 1325 is to recover data1 1932 in cases where syncmark1 1921 is missed, and also to generate part of the LLR that corresponds to data1 1932, for use by LDPC decoder 1335. To recover data1 1932, ERC module 1325 buffers Viterbi output to memory. Once syncmark2 is found, ERC module 1325 knows the start location of data1 1932 because the length of data1 1932 is fixed, and starts outputting data from that location. However, because data1 so recovered is not completely reliable, there is no point in making a precise LLR computation. Therefore, ERC module 1325 will not compute LLR as precisely as if syncmark1 had not been missed, thereby reducing complexity. ERC module 1325 also will not generate an error event for the data1 portion. This means that post-processor 1345 will not be able to correct any error in data1, again to reduce complexity.

The LLR may be computed as follows.

ERC module 1325 will only attempt to compute LLR that is consistent with NRZ data. To reduce complexity, the magnitude of LLR may be user-programmable. One can define:
s=the NRZ syndrome of the considered block
x=a user-programmable value
$m=2^n-1$ where n is the number of syndrome bits.
LLR may be defined is a vector with a number of entries equal to the maximum possible value of m, which is 7 if the number of syndrome bits is 3 (tribit).
If s=0, then:

$L_i = x$ for $i=0,1,\ldots,m-1$ $L_i=0$ for $i=m,\ldots,6$ (where m<7).
If s≠0, then:

$L_{s-1} = -x$ $L_i=0$, for all i except i=s−1.
The following examples are illustrative:

| Parity | s | x | L |
|---|---|---|---|
| Tribit | 0 | 5 | [5 5 5 5 5 5 5] |
| Tribit | 110b (6d) | 5 | [0 0 0 0 0 −5 0] |
| Dibit | 0 | 5 | [5 5 5; 0 0 0 0] |
| Dibit | 11b (3d) | 5 | [0 0 −5; 0 0 0 0] |
| Single Parity Check | 0 | 5 | [5; 0 0 0 0 0 0] |
| Single Parity Check | 1 | 5 | [−5; 0 0 0 0 0 0] |

LDPC decoder 1335 and post-processor 1345 have to be able to receive data from both ERC module 1325 and SOVA decoder 1315 at the same time, because when syncmark1 is found, ERC module 1325 will output data and LLRs for data1, and SOVA decoder 1315 will output data, LLRs, and error events for data2.

Figure 20:
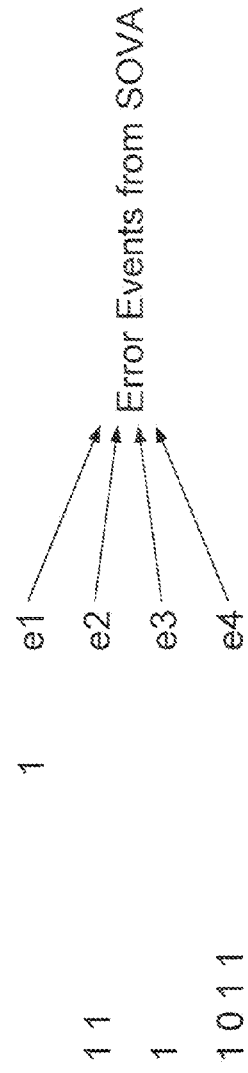
FIG. 20 is an example of error correction in a dibit architecture.

The role of LDPC decoder 1335 is to receive LLRs from SOVA decoder 1315 and provide a hard decision to post-processor 1345. The hard decision will indicate the correct syndrome of the TPC inner code. Based on that hard decision, post-processor 1345 will select which error event to correct. In the example in FIG. 20, a dibit architecture has an inner block length of 10 bits. The data from the Viterbi detector are 1011000100, so the syndrome of the data is 00. The hard decision from LDPC decoder 1325 is 10. The error events from SOVA decoder 1315 are shown. To make the data have the same syndrome as the output of LDPC decoder 1335, post-processor 1345 has to pick error event e1, so the corrected data are 1011000101.

Post-processor 1345 also should zero out the TPC parity locations. If a tribit architecture is used with parity-check matrix $H_3$ given above and the wxyz encoding scheme given above, then post-processor 1345 can zero out the TPC parity locations as follows:

For a symbol where the parity bits are at the beginning, the parity can simply be replaced with 0:

$b_9b_8b_7b_6b_5b_4b_3b_2b_1b_0$ ⟶ $000b_6b_5b_4b_3b_2b_1b_0$
Symbol after correction    Read channel output
                            to hard drive controller For a symbol where the parity bits are at the end
$b_9b_8b_7b_6b_5b_4b_3b_2b_1b_0 \rightarrow b_9b_8b_7b_6b_5b_4x000$
where $x=b_5+b_4+b_2$.

The operation of a suitable LDPC decoder was explained in detail in above-incorporated application Ser. No. 11/933,831. A suitable LDPC decoder architecture (dibit-tribit decoder) was described in copending, commonly-assigned U.S. patent application Ser. No. 12/323,995, filed Nov. 26, 2008, which is hereby incorporated by reference herein in its entirety. A suitable method by which the post-processor could pick which error events to correct is explained in copending, commonly-assigned U.S. patent application Ser. No. 11/936,578, filed Nov. 7, 2007, which is hereby incorporated by reference herein in its entirety.

Thus it is seen that a data channel using a multi-parity TPC has been provided. It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. An encoder apparatus comprising:
   a receive module that receives a data stream, said data stream including a plurality of parity data blocks each having a first length and a plurality of user data blocks each having a second length greater than said first length;
   a parity generation module that generates a plurality of parity bits based on said data stream and a codeword; and
   a parity insertion module that combines said plurality of parity bits and said data stream to generate encoded bits; wherein:
   a placeholder insertion module inserts placeholders for parity bits in each of said parity data blocks to bring the length of each of said parity data blocks to said second length;
   an error-correcting encoder module generates error-correcting parity bits from said data stream after insertion of said placeholders;
   an interleaver module interleaves said error-correcting parity bits in said data stream;
   a first encoder module processes syndrome bits of said user data blocks to generate first coded bits to replace said placeholders in said parity data blocks; and parity data blocks containing said interleaved error-correcting parity bits are processed with said user data blocks by said first encoder module to generate second coded bits for other of said parity blocks not containing said interleaved error-correcting parity bits.

2. The encoder apparatus of claim 1 wherein said codeword is a word of a block code.

3. The encoder apparatus of claim 2 wherein said block code is a tensor-product code.

4. The encoder apparatus of claim 1 wherein said first encoder module is an LDPC encoder.

5. The encoder apparatus of claim 1 wherein each of said placeholders is a zero.

6. The encoder apparatus of claim 1 wherein said first coded bits are combined with syndrome bits of said parity data blocks prior to replacing said placeholders in said parity data blocks.

7. The encoder apparatus of claim 1 wherein:
said plurality of parity bits is derived from syndromes of a data block in said data stream; said encoder apparatus further comprising:
a processor that derives said syndromes by multiplying a full-rank matrix, having a number of rows equal to said plurality of parity bits, by a respective one of said data blocks.

8. The encoder apparatus of claim 7 wherein:
said plurality of parity bits is two parity bits; and
said matrix has two rows and has, in its first two columns and in its last two columns, respectively, respective two-by-two identity submatrices.

9. The encoder apparatus of claim 7 wherein:
said plurality of parity bits is three parity bits;
said data stream includes parity data blocks and user data blocks; and
said matrix has three rows and has a three-by-three identity submatrix in its first three columns; said encoder apparatus further comprising:
a processor that, for at least one of said parity data blocks, calculates four parity bits from data in said one of said parity data blocks and encoded syndrome bits from one of said user data blocks.

10. An encoding method comprising:
receiving a data stream, said data stream including a plurality of parity data blocks each having a first length and a plurality of user data blocks each having a second length greater than said first length;
generating a plurality of parity bits based on said data stream and a codeword; and
combining said plurality of parity bits and said data stream to generate encoded bits; wherein:
placeholders are inserted for parity bits in each of said parity data blocks to bring the length of each of said parity data blocks to said second length;
error-correcting parity bits are generated from said data stream after insertion of said placeholders;
said error-correcting parity bits are interleaved in said data stream;
syndrome bits of said user data blocks are processed to generate first coded bits to replace said placeholders in said parity data blocks; and
parity data blocks containing said interleaved error-correcting parity bits are processed with said user data blocks to generate second coded bits for other of said parity blocks not containing said interleaved error-correcting parity bits.

11. The encoding method of claim 10 wherein said codeword is a word of a block code.

12. The encoding method of claim 11 wherein said block code is a tensor-product code.

13. The encoding method of claim 10 wherein each of said placeholders is a zero.

14. The encoding method of claim 10 further comprising combining said first coded bits with syndrome bits of said parity data blocks prior to replacing said placeholders in said parity data blocks.

15. The encoding method of claim 10 further comprising:
deriving said plurality of parity bits from syndromes of data blocks in said data stream; and
deriving each said syndrome by multiplying a full-rank matrix, having a number of rows equal to said plurality of parity bits, by a respective one of said data blocks.

16. The encoding method of claim 15 wherein:
said plurality of parity bits is two parity bits; and
said matrix has two rows and has, in its first two columns and in its last two columns, respectively, respective two-by-two identity submatrices.

17. The encoding method of claim 15 wherein:
said plurality of parity bits is three parity bits;
said data stream includes parity data blocks and user data blocks; and
said matrix has three rows and has a three-by-three identity submatrix in its first three columns; said encoding method further comprising:
calculating four parity bits from data in said one of said parity data blocks and encoded syndrome bits from one of said user data blocks.

18. A decoder apparatus comprising:
a detector receiving and outputting encoded data;
a first decoder generating first log-likelihood ratios from said encoded data, said first decoder being a SOVA decoder comprising a traceback unit having a plurality of merged traceback paths;
an error recovery module generating second log-likelihood ratios from said encoded data;
a second decoder that derives syndrome data from said first and second log-likelihood ratios;
a post-processor that combines data from said first decoder with error events from said error recovery module to generate corrected data, said post-processor further identifying a plurality of parity bits in said corrected data and replacing each of said parity bits with a placeholder; and
a placeholder removal unit that identifies and removes said placeholder that replaced said parity bits.

19. The decoder apparatus of claim 18 wherein each of said placeholders is a zero.

20. A decoding method comprising:
detecting and outputting encoded data;
generating first log-likelihood ratios from said encoded data;
generating second log-likelihood ratios based on error events in said encoded data;
deriving syndrome data from said first and second log-likelihood ratios;
combining data with error events to generate corrected data, said error events being derived from a plurality of merged traceback paths;
identifying a plurality of parity bits in said corrected data and replacing each of said parity bits with a placeholder; and
identifying and removing said placeholders that replaced said parity bits.

21. The decoding method of claim 20 wherein each of said placeholders is a zero.

* * * * *